United States Patent [19]

Sato et al.

[11] Patent Number: 5,325,012
[45] Date of Patent: Jun. 28, 1994

[54] BONDED TYPE PIEZOELECTRIC APPARATUS, METHOD FOR MANUFACTURING THE SAME AND BONDED TYPE PIEZOELECTRIC ELEMENT

[75] Inventors: Ichiya Sato, Hitachi; Takao Yoneyama, Katsuta; Hisanori Okamura, Ibaraki; Satoshi Kokura, Hitachiohta; Minoru Yanagibashi, Naka, all of Japan

[73] Assignees: Hitachi, Ltd, Tokyo; Hitachi Material Engineering, Ltd., Katsuta; Hitachi Engineering Service Co., Ltd., Ibaraki, all of Japan

[21] Appl. No.: 837,977

[22] Filed: Feb. 20, 1992

Related U.S. Application Data

[63] Continuation of Ser. No. 584,643, Sep. 19, 1990, abandoned.

[30] Foreign Application Priority Data

Sep. 19, 1989 [JP] Japan .................. 1-240576

[51] Int. Cl.$^5$ .................................... H01L 41/08
[52] U.S. Cl. ........................ 310/364; 310/346
[58] Field of Search ........................ 310/346, 364

[56] References Cited

U.S. PATENT DOCUMENTS

| | | | |
|---|---|---|---|
| 2,430,013 | 11/1947 | Hansell .................. | 310/346 |
| 3,230,503 | 1/1966 | Elliot et al. .................. | 310/346 |
| 3,243,792 | 3/1966 | Hamilton .................. | 310/364 |
| 3,441,754 | 4/1969 | Heny .................. | 310/364 |
| 3,573,511 | 4/1971 | Noren .................. | 310/346 |
| 3,683,211 | 8/1972 | Perlman et al. .................. | 310/346 |
| 3,740,822 | 6/1973 | Singleton .................. | 29/419 |
| 3,891,873 | 6/1975 | Yanagasawa et al. .................. | 310/364 |
| 4,075,364 | 2/1978 | Panzera .................. | 427/34 |
| 4,109,031 | 7/1978 | Marscher .................. | 427/191 |
| 4,111,572 | 9/1978 | Noone .................. | 403/28 |
| 4,297,607 | 10/1981 | Lynnworth et al. .................. | 310/334 |
| 4,338,300 | 7/1982 | Erickson et al. .................. | 428/594 |
| 4,381,469 | 4/1983 | Ogawa et al. .................. | 310/313 R |
| 4,433,264 | 2/1984 | Nishiyama et al. .................. | 310/364 |
| 4,445,066 | 4/1984 | Nishiyama et al. .................. | 310/364 |
| 4,468,582 | 8/1984 | Fujiwara et al. .................. | 310/364 |
| 4,490,641 | 12/1984 | Takeuchi et al. .................. | 310/348 |
| 4,551,647 | 11/1985 | Day .................. | 310/346 |
| 4,609,427 | 9/1986 | Inamoto et al. .................. | 156/633 |
| 4,769,882 | 9/1988 | Rosen et al. .................. | 310/364 |
| 4,804,007 | 2/1989 | Bran .................. | 310/334 |
| 4,825,117 | 4/1989 | Thomas et al. .................. | 310/346 |
| 4,890,783 | 1/1990 | Li .................. | 228/122 |
| 5,161,728 | 11/1992 | Li .................. | 228/124 |

FOREIGN PATENT DOCUMENTS

| | | | |
|---|---|---|---|
| 3638286 | 5/1988 | Fed. Rep. of Germany ...... | 310/346 |
| 132187 | 10/1979 | Japan .................. | 310/346 |
| 00814 | 6/1985 | Japan .................. | 310/364 |
| 98710 | 6/1985 | Japan .................. | 310/346 |
| 70582 | 3/1988 | Japan .................. | 310/346 |
| 0030473 | 2/1989 | Japan .................. | 310/346 |
| 0218687 | 9/1991 | Japan .................. | 310/358 |
| 1080244 | 3/1984 | U.S.S.R. .................. | 310/346 |

*Primary Examiner*—Thomas M. Dougherty
*Attorney, Agent, or Firm*—Antonelli, Terry, Stout & Kraus

[57] ABSTRACT

The features of the present invention are 1) to apply metallization on the bonding surface of a piezoelectric ceramic with a metal likely to react with the piezoelectric ceramic material, 2) when the piezoelectric ceramic material is soldered on the bonding surface, to apply metallization with a metal likely to react with the solder material, 3) to provide between the metallizing layers formed in 1) and 2) a metallizing layer including metal which prevents reaction between the metals and their diffusion, 4) to use a mounting member for the piezoelectric ceramic which has substantially the same thermal expansion coefficient as the piezoelectric ceramic in non-polarization condition and 5) to solder in the non-polarization condition and thereafter to polarize. As the result, a bonded type piezoelectric apparatus with a high reliability or with a broad application temperature range near from the absolute zero temperature to the Curie point of the piezoelectric element, and a method of manufacturing the same are provided.

13 Claims, 8 Drawing Sheets

×400  50μm

×400  40μm

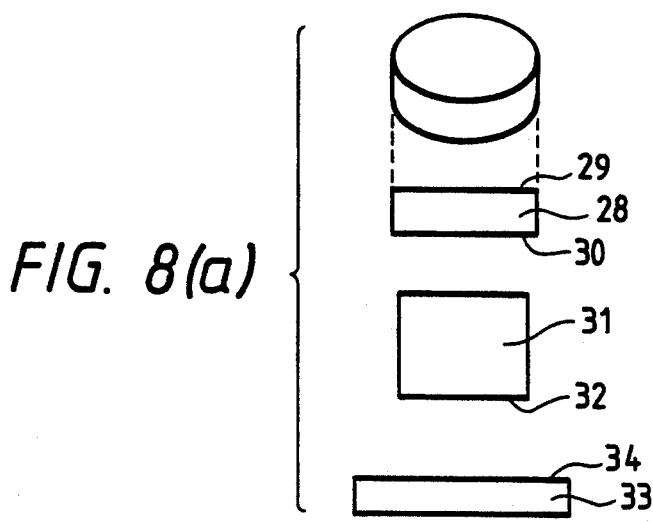
FIG. 8(a)
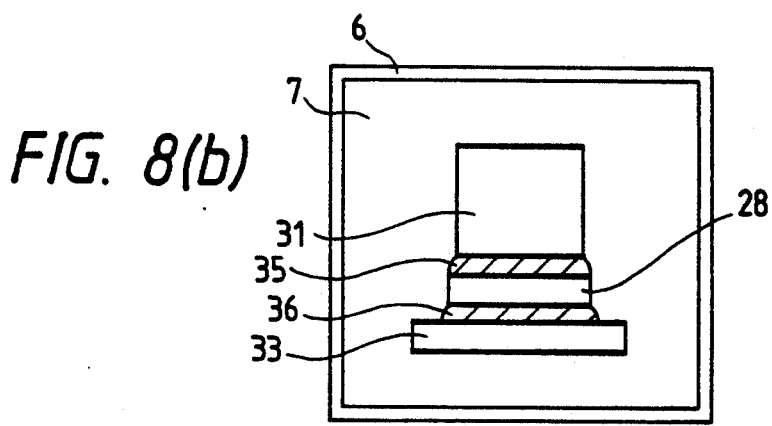
FIG. 8(b)
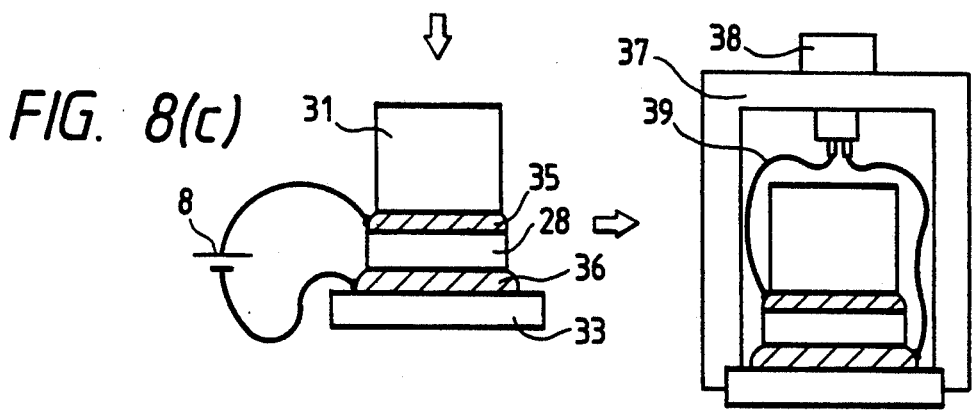
FIG. 8(c)
FIG. 8(d)

BONDED TYPE PIEZOELECTRIC APPARATUS, METHOD FOR MANUFACTURING THE SAME AND BONDED TYPE PIEZOELECTRIC ELEMENT

This is a continuation of application Ser. No. 07/584,643, filed Sep. 19, 1990 now abandoned.

BACKGROUND OF THE INVENTION

The present invention relates to a bonded type piezoelectric apparatus composed of a piezoelectric ceramic element bonded with a mounting member into one body and a method of manufacturing the same and, more particularly, to a ceramic piezoelectric apparatus which is suitable to sensors for detecting an elastic wave and various actuators and a method of manufacturing the same.

Elements for converting an electric quantity into a mechanical quantity, namely, what is called transducers, of various system are known and used as sensors and various actuators. One of them is a piezoelectric type transducer and, in particular, a transducer utilizing the piezoelectric characteristic of a piezoelectric ceramic, namely, a ceramic piezoelectric apparatus is widely used.

In some of such conventional bonded type piezoelectric apparatuses, a synthetic resin adhesive is used in manufacturing them. Such piezoelectric apparatuses are only usable in a temperature range of, for example, −40° C. to 80° C.

Recently, however, non-destructive testing techniques such as an acoustic emission (AE) method, an ultrasonic flaw detecting (UT) method and a vibration method have been developed. In the case of adopting these technique, the ambient temperature is too high for the above-described conventional bonded type piezoelectric apparatuses.

Further, in an application for monitoring a superconductivity apparatus, such is required to be used in an extremely low temperature, the conventional ceramic piezoelectric apparatus could not be used.

When a sensor is applied to the AE method, it is necessary to transmit the elastic wave supplied from the outside to a sensor element with efficiency and to have a sufficient sensitivity as a sensor, so that what is called a bonded type piezoelectric sensor is necessary, which is composed of a sensor element of a piezoelectric ceramic material with a bonded surface thereof bonded with a mounting member into one body. The above-described conventional bonded type piezoelectric apparatuses, however, are difficult to apply to the sensor, because a synthetic resin adhesive is used for bonding, which greatly attenuates the elastic wave.

As a countermeasure, a method of bonding these members by soldering has been proposed in, for example, Japanese Patent Application Laid-Open Nos. 52-19094 (1977), 58-99100 (1983) and 57-201399 (1982). Among the above three prior arts, in the apparatus disclosed in Japanese Patent Application Laid-Open No. 52-19094 (1977), piezoelectric element are directly soldered to a metal body at a temperature of not higher than the Curie temperature (190° C.) of the piezoelectric element in order to enhance the efficiency of the sensor element, and in the apparatus disclosed in Japanese Patent Application Laid-Open No. 58-99100 (1983), the polarized piezoelectric element is directly bonded by a solder having a low melting point (143° C.) in order to shorten the bonding time, and further, in the apparatus disclosed in Japanese Patent Application Laid-Open No. 57-201399 (1982), because the polarization is destroyed during a high temperature treatment, therefore, for preventing the same, before inducing the polarization, an electrode face formed by metallizing (usually carried out with Ag) the bonding surface of the piezoelectric element and an acoustic matching layer are bonded and the polarization treatment is carried out.

Accordingly, these apparatus can be used at temperatures upto the melting point of the solder which is higher than the above mentioned temperature 80° C., however, the members are merely and directly bonded or the metallizing layer is merely formed with Ag, there was a problem that the bonded portion is likely to peel off at high or low temperatures during the use. In addition, since the thermal expansion coefficient of the piezoelectric ceramic is not taken into any consideration, the thermal strain caused during soldering is generated as a residual stress, which brings about problems such as the separation of the bonded portion and the breakage of the piezoelectric element during the manufacturing process or use.

SUMMARY OF THE INVENTION

An object of the present invention is to provide a highly reliable bonded type piezoelectric apparatus in which the peeling off of the bonded portion and the breakage of the piezoelectric element are prevented, and to provide a method for manufacturing the same.

Another object of the present invention is to provide a bonded type piezoelectric apparatus which can be used in a sufficiently broad temperature range near from the absolute zero upto the Curie temperature of the piezoelectric element.

The above objects is achieved by providing an active layer formed by coating (metallizing) the bonding face of the piezoelectric ceramic material with a metal including a metal which is likely to react with the piezoelectric ceramic material, such as titanium (Ti), zirconium (Zr), hafnium (Hf), niobium (Nb), tantalum (Ta), molybdenum (Mo), and tungsten (W). Further, when the piezoelectric ceramic material is bonded with a solder, in addition to the above measure, the objects are achieved by providing a soldering layer formed by metallizing the soldering bonding layer with metals such as Au and Ag which is likely to react the soldering component. Still further, when the above two measures are employed, the objects are achieved by providing a barrier layer between the active layer and the soldering layer formed by metallizing a metal such as platinum (Pt), nickel (Ni) and chromium (Cr) which prevents brittling due to reaction or diffusion of the metals in the above two layers.

Moreover the above objects is achieved by selecting a mounting material for the piezoelectric ceramic material having a substantially the same thermal expansion coefficient as that of the piezoelectric ceramic material in non-polarization state. Finally, the above objects is further achieved by soldering the piezoelectric ceramic material and thereafter by polarizing after at least one of the above measures is applied.

with the provision of the active layer on the bonding layer, the metal forming the active layer is firmly bonded with the piezoelectric ceramic material through the reaction therewith so that the piezoelectric ceramic material is unlike to peel off. Further in case of solder bonding, the metal forming the soldering layer reacts with the solder constituting the soldering layer, and the soldering layer is firmly bonded to the securing member of the piezoelectric ceramic material via the solder bonding layer. As the result, the piezoelectric ceramics is hardly peeled off from the above member. Further, with the provision of the barrier layer between the active layer and the soldering layer the brittling of the both layers is avoided by preventing the intermetallic reaction and diffusion of the both layers. As the result, a further reliable bonded type piezoelectric apparatus is provided.

Hereinbelow, the the thermal expansion coefficient of the securing member and the function of non-polarization soldering and polarization thereafter are explained.

when a piezoelectric ceramic element is bonded by metallic soldering using a hard solder such as a silver solder or a soft solder such as a solder, the bonding temperature becomes considerably high. A piezoelectric ceramic element has to be polarized so as to have a piezoelectric characteristic. Since the thermal expansion coefficient of the polarized piezoelectric ceramic is increased, the residual stress is increased by bonding, so that the piezoelectric ceramic is apt to be broken. If the piezoelectric ceramic is non-polarized, bonded in this non-polarized state and subjected to a predetermined polarization process after the completion of bonding, the residual stress is reduced, and a ceramic piezoelectric apparatus having reliability free from the fear of breakage is obtained. Together with the above measure, when a securing member having substantially the same thermal expansion coefficient as the thermal expansion coefficient ($5 \times 10^{-6}/°C.$) of the piezoelectric ceramics in non-polarization state, the peeling off of the boding portion and the breakage of the piezoelectric ceramics due to the thermal expansion difference is avoided.

BRIEF DESCRIPTION OF THE DRAWINGS

FIGS. 8(a) to 8(d) show explanatory views of a further embodiment of the present invention.

DETAILED EXPLANATION OF THE PREFERRED EMBODIMENTS

A ceramic piezoelectric apparatus and a method of manufacturing the same according to the present invention will be explained in details with reference to the embodiments shown in the accompanying drawings.

Figure 1A:
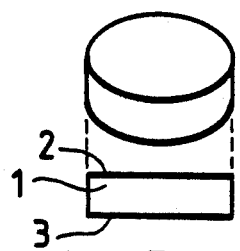
FIGS. 1(a) to 1(d) show views of one embodiment of a bonded type piezoelectric apparatus and a method for manufacturing the same according to the present invention.
Figure 1B:
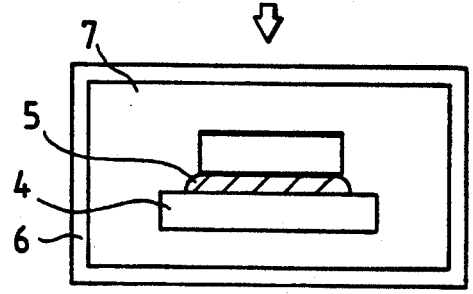
Figure 1C:
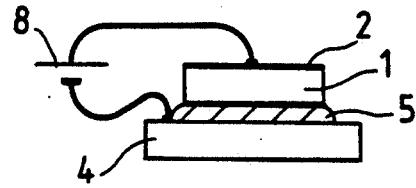
Figure 1D:
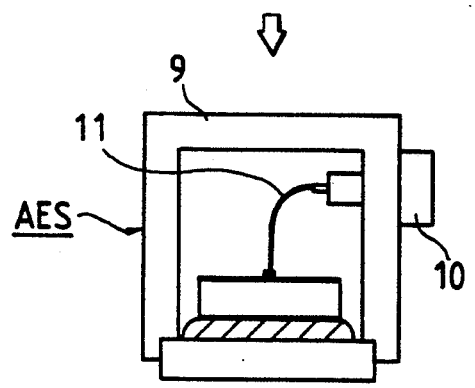
Figure 2:
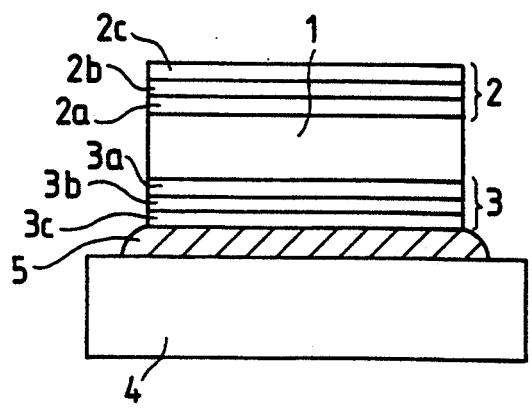
FIG. 2 is a constitutional view of a metallizing layer in the embodiment of FIG. 1.

FIG. 1 and FIG. 2 show an embodiment of the present invention which is applied to an unbalanced sensor used for an acoustic emission method (hereinunder referred to "AE method"). FIG. 1 shows the manufacturing process and the completed apparatus, and FIG. 2 is a view showing metallizing and bonding condition of the piezoelectric ceramics with a metallic mounting plate 4, in other words a securing member. A planar piezoelectric ceramic 1 for an element is first prepared, as shown in FIG. 1 (a), and its both sides are subjected to a metallizing treatment as shown in FIG. 2. Among the metallized layers formed by the metallizing treatment, the metallizing layer which forms an electrode extending to a lead wire is called a metallized layer 2, and the metallizing layer which is bonded to a member securing the piezoelectric element is called a bonded metallized layer 3. The non-polarized state of the piezoelectric ceramic 1 is confirmed, and the piezoelectric ceramic 1 is depolarized, if necessary. The piezoelectric ceramic 1 in a polarized state is placed on a mounting plate 4 of a metal material such as a mild steel with a predetermined soldering material 5 interposed therebetween, as shown in FIG. 1 (b), and is inserted into a high-temperature oven 6. The interior 7 of the oven is evacuated or filled with an inert gas such as argon, and the temperature is raised above the melting point of the soldering material 5 so as to solder the piezoelectric ceramic 1 and the mounting plate 4. As the soldering material, a solder or a silver solder is used.

After bonding, the bonded product is gradually cooled, and when the temperature of the product is restored to ordinary temperature, it is taken out of the high-temperature oven 6. A predetermined voltage is applied to the electrode surface 2 and the mounting plate 4 from a predetermined power source 8, as shown in FIG. 1 (c), thereby applying an electric field to the piezoelectric ceramic 1 for polarization.

Thereafter, a predetermined metal case 9 is attached to the product, as shown in FIG. 1 (d), and the product is connected to a connector 10 through a lead wire 11, thereby completing an unbalanced sensor AES used in an AE method. The sensor AES is called an unbalanced sensor because one electrode (lower electrode) of the piezoelectric ceramic 1 is directly connected to the metal mounting plate 4 so that the sensor is used in the state of being kept in a common potential.

Nextly, the metallizing treatment and the bonding by soldering are explained in detail with reference to FIG. 2. The metallizing layer of the present embodiment includes active layers 2a, 3a, solder layers 2c, 3c and barrier layers 2b, 3b. On the both faces of the piezoelectric ceramics 1 the active layers 2 are bonded. These active layers 2 are composed of elements with which a high bonding strength is obtained through reaction with the piezoelectric ceramic. As such elements, titanium (Ti), zirconium (Zr), hafnium (Hf), niobium (Nb), tantalum (Ta), molybdenum (Mo) and tungsten (W) which are likely to react with oxygen to form a reaction product, since the piezoelectric ceramics 1 used in the present invention such as lead zirconate titanate, lead titanate and lead niobate includes oxygen. Nextly the barrier layers 2b, 3b are bonded thereon for preventing the active layers 2a, 3a and the solder layers 2c, 3c metallized thereafter from becoming brittle because of their reaction or diffusion. Platinum (Pt), nickel (Ni) and chromium (Cr) which are stable at high temperatures are used for the barrier layers 2b, 3b.

Further, on the barrier layers 2b, 3b the solder layers 2c, 3c are bonded for facilitating bonding of solder materials such as soft solder and silver solder. For this solder layer 2c, 3c such as gold (Au) and silver (Ag) are used which are stable and wettable and easily bondable with solder materials. For these metallizing treatment, a vapor deposition method and a sputtering method which physically deposit metal vapor are preferable, because with conventional methods such as a thick film method which uses application of silver paste and a chemical plating method the film was thick such that a sufficient bonding strength could not be obtained. Thereafter the treatment following FIG. 1 (b) as explained is carried out.

Figure 3A:
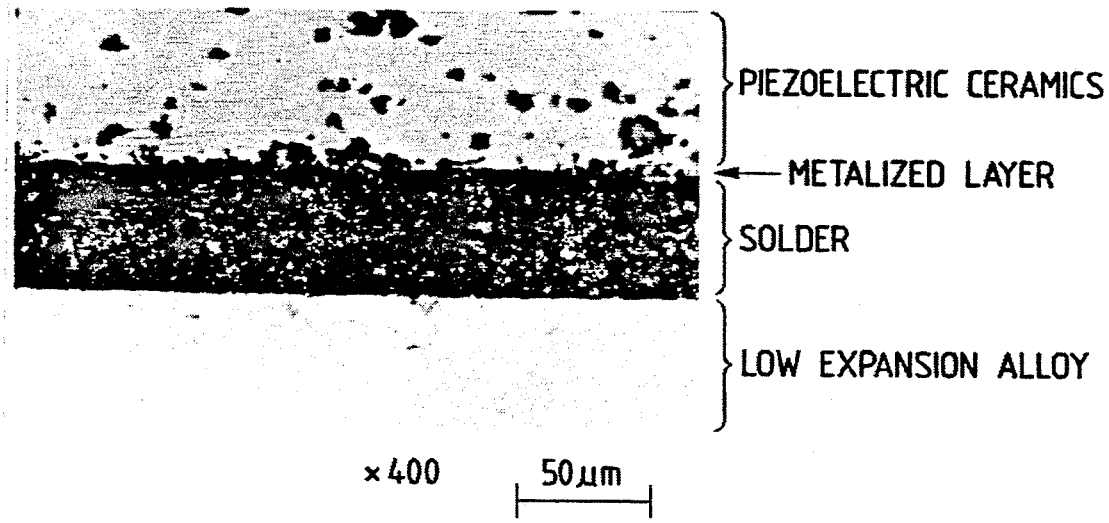
FIGS. 3(a) and 3(b) show bonding states of the present invention and a conventional example.
Figure 3B:
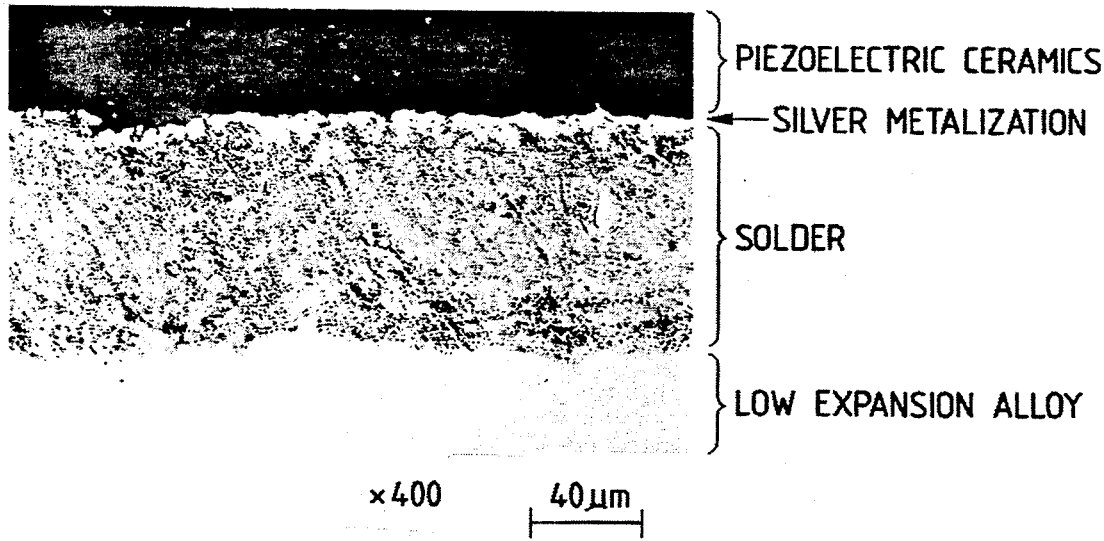

Through soldering the piezoelectric ceramics thus metallized on a metallic mounting plate or an insulation use ceramics, a desirable wetting for solder materials is obtained by the solder layer, the bonding is effected over the entire bonding surface, defects such as blow holes are reduced and the bonding strength is increased. FIG. 3 shows these conditions. FIG. 3 (a) shows a bonding condition by metallizing according to the present invention wherein the active layer metal is Ti, the barrier layer metal is Pt and the solder layer metal is Au and FIG. 3 (b) shows a conventional bonding condition formed by the silver paste coating. When looking at the metallizing layers between the piezoelectric ceramics and the solder portion, in the conventional example a white silver layer which forms the metallizing layer is clearly recognized which shows insufficient bonding between the piezoelectric ceramics and the solder portion, on the other hand, in the present invention the metallizing layer can not be clearly recognized which shows that the solder material (black portion) constituting the solder portion diffuses into the piezoelectric ceramics and the both are sufficiently bonded. For evaluating the bonding strength of the metallizing layer for the piezoelectric ceramics of the present invention, a metal wire was soldered on the metallized layer and pulled, and it was found out that the tensile strength is more than 3 kg/mm$^2$.

Hereinbelow, the thermal expansion coefficient and the advantages in non-polarization condition are explained.

Figure 4:
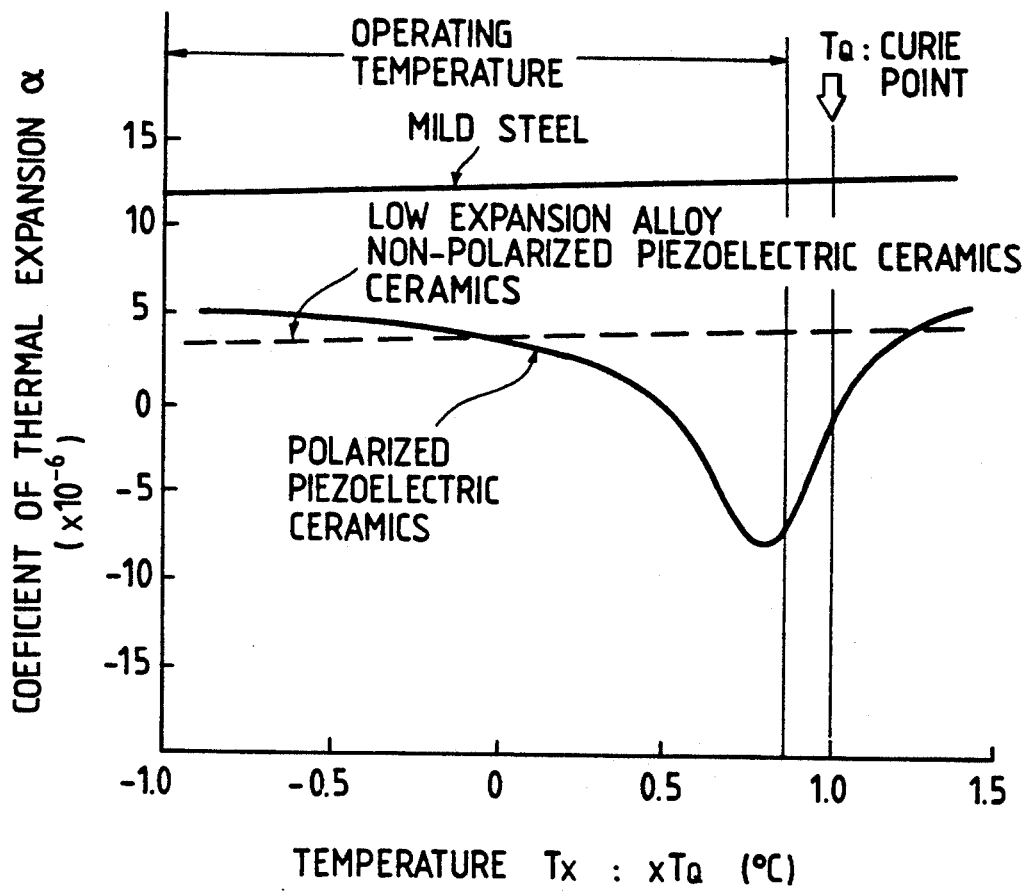
FIG. 4 is a thermal expansion coefficient characteristic curve of the piezoelectric ceramics.
Figure 5A:
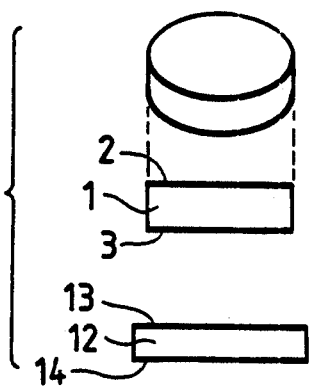
FIGS. 5(a) to 5(d) show another embodiment of a bonded type piezoelectric apparatus and a method for manufacturing the same according to the present invention.
Figure 5B:
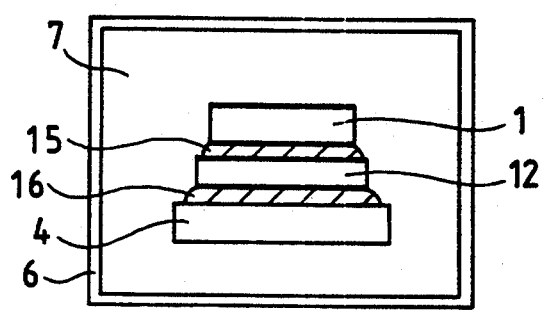
Figure 5C:
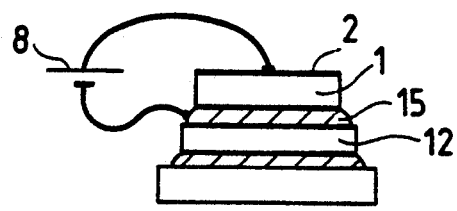
Figure 5D:
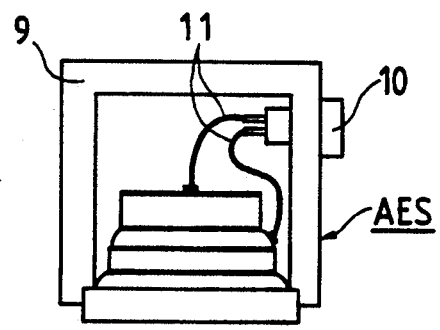

Examples of the piezoelectric ceramic 1 of a sensor used for an AE method are lead zirconate titanate (Curie point: 320° to 370° C.), lead titanate (Curie point: 460° C.) and lead niobate (Curie point: 570° C.) as mentioned above. As examples of the soldering material used for bonding, a high-melting soldering (melting point: 307° C.) and a silver-copper solder (melting point: 730° C.) will be cited. As the metal mounting plate 4 with which the piezoelectric ceramic is bonded, a low thermal expansion alloy, a mild steel and the like are usable. On the assumption that these materials are used, the thermal expansion coefficients a are as shown in FIG. 4. In FIG. 4, the abscissa represents a temperature, and as the temperature Tx, a multiple of the Curie temperature $T_Q$ of a piezoelectric ceramic is used. As is obvious from FIG. 4, there is a considerable difference in the thermal expansion coefficient between a piezoelectric ceramic and a mild steel. It is observed that especially, in the polarized piezoelectric ceramic, the thermal expansion coefficient greatly changes from a positive value to a negative value in the vicinity of the Curie point.

Therefore, if the piezoelectric ceramic is bonded with the mild steel as it is by soldering or the like without taking into consideration of the polarized state as in the prior art, the piezoelectric ceramic may be bonded with the mild steel in the vicinity of the Curie point $T_Q$ in FIG. 4. In this case, the mounting plate of the soft steel which is considerably expanded with a positive large thermal expansion coefficient is bonded with the piezoelectric ceramic which is considerably shrunken with a negative large thermal expansion coefficient. As a result, a large residual stress is generated and the mechanical strain due to a change in temperature involves a fear of separating the bonded portion or breaking the piezoelectric ceramic element. On the other hand, according to the above-described embodiments, since the piezoelectric ceramic 1 is in a non-polarized state at the time of soldering, even if it is heated to a temperature in the vicinity of or above the Curie point $T_Q$ for bonding, no large difference in the thermal expansion coefficient is caused between the mounting plate and the piezoelectric ceramic as is apparent from FIG. 4, thereby ensuring the reliable bonded state. Thus, it is easy to obtain a sensor for an AE method with high accuracy and high reliability.

According to these embodiments, it is possible to prevent the generation of a large residual stress at the time of bonding the mounting plate 4 and the piezoelectric ceramic 1 by metallic soldering, so that it is possible to use any given soldering material without taking into account the Curie point $T_Q$ of the piezoelectric ceramic. It is therefore possible to provide a sensor which is usable in a wide temperature range from a very low temperature to a high temperature. It is also possible to obtain a sensor which has a sufficiently good elastic wave transmission characteristic, a high sensitivity and a very high reliability with easiness.

Although a mild steel is used as the metal mounting plate 4 in the above-described embodiments, a predetermined low expansion alloy having a substantially equal thermal expansion coefficient to that of the piezoelectric ceramic 1 may be used instead. Use of a low expansion alloy can further suppress the generation of a residual stress, thereby providing a ceramic piezoelectric apparatus having higher accuracy and reliability. When these piezoelectric ceramics were subjected to a heat cycle from Just below the melting point of the solder material to the extreme low temperature (−269° C.) in liquid helium, no separation and damage were caused.

Figure 6:
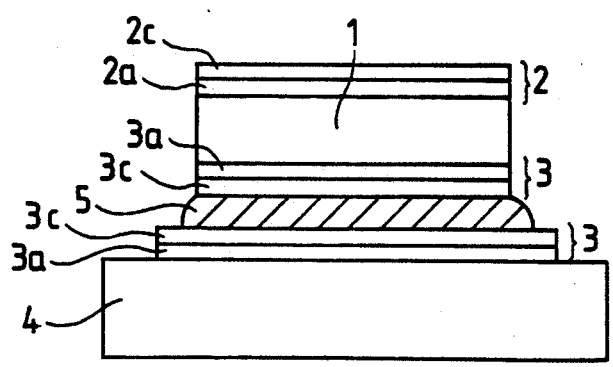
FIG. 6 is a constitutional view of a metallizing layer in the embodiment of FIG. 5.

FIG. 5 and FIG. 6 show an embodiment of the present invention which is applied to a balanced sensor used for an AE method. On the metallizing layer of the present embodiment, no barrier is provided as shown in FIG. 6. At first overall manufacturing process is explained with reference to FIG. 5. As shown in FIG. 2 (a), the electrode 2 and the bonding metallized layer 3 of the piezoelectric ceramic 1 in a non-polarized state are applied with a metallizing treatment in a manner shown in FIG. 6. The reference numeral 12 represents an insulating ceramic material, and the upper bonding metallizing layer 13 and the lower metallizing layer 14 thereof are also metallized. At this time, an annular portion is left non-metallized at the peripheral portion of the upper bonding metallizing layer 13 in order to prevent unnecessary flow of the soldering material, as will be described later. The piezoelectric ceramic 1 is laminated on the mounting plate 4 of a metal material with the insulating ceramic material 12 interposed therebetween, as shown in FIG. 5 (b), and is placed into the high-temperature oven 6. An upper soldering material 15 and a lower soldering material 16 of a predetermined soldering material are inserted between the piezoelectric ceramic 1 and the insulating ceramic material 12 and between the insulating ceramic material 12 and the mounting plate 4, respectively. The interior 7 of the oven is evacuated or filled with an inert gas such as argon, and the temperature is raised above the melting point of the soldering material 5 so as to solder-bond the piezoelectric ceramic 1 and the mounting plate 4. After bonding, the bonded product is gradually cooled, and when the temperature of the product is restored to ordinary temperature, it is taken out of the interior 7 of the oven 6. The predetermined power source 8 for polarization is connected to the electrode metallizing layer 2 and the upper soldering material 15, as shown in FIG. 5 (c), thereby polarizing the piezoelectric ceramic 1. Finally, the product is accommodated in the predetermined metal case 9, as shown in FIG. 5 (d), and the electrode metallizing layer 2 and the upper soldering material 15 are connected to each other through the lead wires 11. The metal case 9 is attached to the mounting plate 4, thereby completing a balanced sensor AES.

In the above-described process, the upper soldering material 15 and the lower soldering material 16 may be either of the same material or of different materials having different melting points. It goes without saying that when different materials are used, the soldering material having a higher melting point is used for a first bonding and the other soldering material is next used for a second bonding.

FIG. 6 shows the bonding condition through the metallizing layer composed of the active layers 2a, 3b and the solder layers 2c, 3c. The method of metallizing is the same as that in the second embodiment. The metallizing layer of the present embodiment includes no barrier layer such that its strength is slightly lower than that of the second embodiment however has a sufficiently high strength in comparison with that of the conventional ones.

With the present embodiment, the same advantages as the first embodiment are obtained. For the method of metallizing in the present embodiment, the three layered metallizing method as in the first embodiment may be used or for the second embodiment the two layered metallizing method in the present embodiment may be used.

Figure 7:
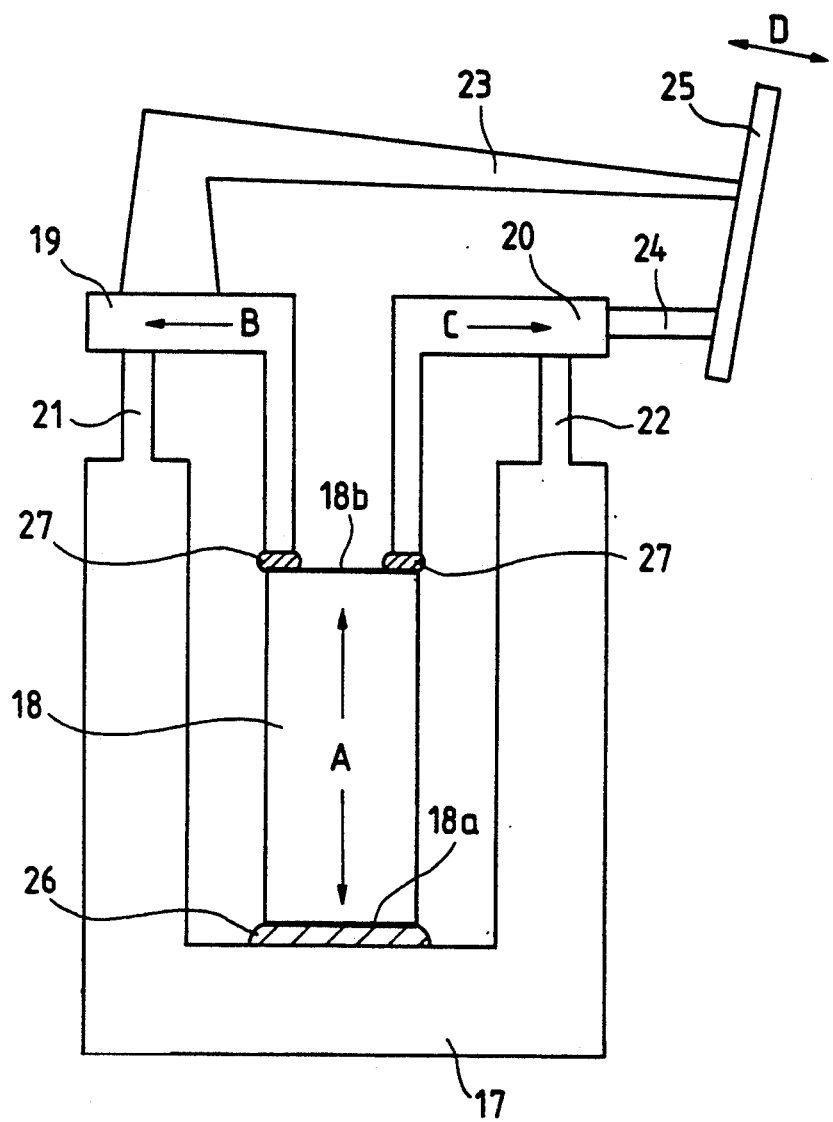
FIG. 7 is an explanatory view of still another embodiment of the present invention.

Next, an embodiment in which the bonded type piezoelectric device according to the present invention is applied to an piezoelectric actuator is explained with reference to FIG. 7. The piezoelectric actuator is used as an impact printer head or a mechanical contact relay by utilizing the electric quantity to mechanical quantity converting function of a piezoelectric ceramic, as well known. In contrast, the above-described sensor can be said to utilize the mechanical quantity to electric quantity converting function of a piezoelectric ceramic. FIG. 7 shows an embodiment of a piezoelectric actuator. A piezoelectric ceramic 18 is attached to a base block 17 having a shape shown in FIG. 4, and a left arm 19 and a right arm 20 are attached to the upper open end of the piezoelectric ceramic 18. The left arm 19 and the right arm 20 are supported by a left support 21 and a right support 22, respectively, at the upper portion of the base block 17. A left transmission lever 23 and a right transmission lever 24 are further attached to the left arm 19 and the right arm 20, respectively.

A driving lever 25 is attached to the ends of the left transmission lever 23 and the right transmission lever 24.

Therefore, if a predetermined voltage of a predetermined polarity if applied to the electrodes 18a and 18b of the piezoelectric ceramic 18 which is polarized in a predetermined direction, the piezoelectric ceramic 18 generates a stress in the direction indicated by the arrow A and is displaced, the displacement being represented by the arrow B in the left arm 19 and the arrow C in the right arm 20. As a result of this displacement, the driving lever 25 is moved in the direction indicated by the arrow D, thereby functioning the apparatus as a piezoelectric actuator.

By the driving lever 25, the head of an impact printer and a relay contact can be driven.

In the embodiment shown in FIG. 7, the piezoelectric ceramic 18 is attached to the base block 17 by metallic soldering with a lower soldering material 26 and the left arm 19 and the right arm 20 are also attached to the piezoelectric ceramic 18 by metallic soldering with an upper soldering material 27. At the time of metallic soldering with the lower soldering material 26 and the upper soldering material 27, the piezoelectric ceramic 18 is first metallized, soldered by a predetermined soldering material under the condition that the piezoelectric ceramic 18 is in a non-polarized state, and then polarized in the same way as in the two embodiments with the methods shown in FIG. 2 or 6.

Therefore, according to this embodiment, since it is possible to sufficiently suppress the generation of the residual stress at the bonded portion when the piezoelectric ceramic 18 is bonded to the base block 17 and when the left arm 19 and the right arm 20 are bonded to the piezoelectric ceramic 18 in spite of the adoption of metallic soldering, firm bonding and a high reliability are easily obtained, and it is possible to provide a piezoelectric actuator which is usable in a wide temperature range.

FIG. 8 shows an embodiment of the present invention which is applied to an ultrasonic flaw detecting transducer. As shown in FIG. 8 (a), the damper surface and the mounting surface of a piezoelectric ceramic 28 are first metallized to form a damper metallizing layer 29 and a mount metallizing layer 30 as shown in FIG. 2 or FIG. 6. A damper 31 of a composite material of a low expansion alloy and a ceramic plate 33 are prepared, and their bonding surfaces are similarly metallized to form bonding metallizing layers 32, 33. After that the piezoelectric ceramic 28 is in a non-polarized state is confirmed, the ceramic plate 33, the piezoelectric ceramic 28 and the damper 31 are laminated in that order with soldering materials 35 and 36 therebetween, as shown in FIG. 8 (b). The laminated materials are placed in the high-temperature oven 6, and the interior 7 of the oven is kept in a vacuum state or a state of being filled with an inert gas such as argon. The laminated materials are heated to a temperature above the melting point of the soldering materials 35 and 36 so as to solder the materials each other. As the soldering materials, a soft solder, a silver solder, etc. are usable in the same way as in the previous embodiments. After bonding, the bonded product is gradually cooled, and when the temperature of the product is restored to ordinary temperature, it is taken out of the high-temperature oven 6. The product is connected to a power source for polarization so as to polarize the piezoelectric ceramic 28, as shown in FIG. 8 (c). Finally, a metal case 37, a connector 38, and a lead wire 39 are attached to the product, as shown in FIG. 8 (d), thereby completing an ultrasonic flaw detecting transducer.

Thus, in the ultrasonic flaw detecting transducer shown in FIG. 8 (d), all the components are bonded by metallic soldering and the residual stress produced on the piezoelectric ceramic 28 can be restricted to a sufficiently small value in spite of metallic soldering. It is therefore possible to apply the transducer in a wide temperature range and, in addition, to provide the transducer with a sufficiently high reliability.

Examples of application of a ceramic piezoelectric apparatus according to the present invention will be explained hereinunder.

Figure 9:
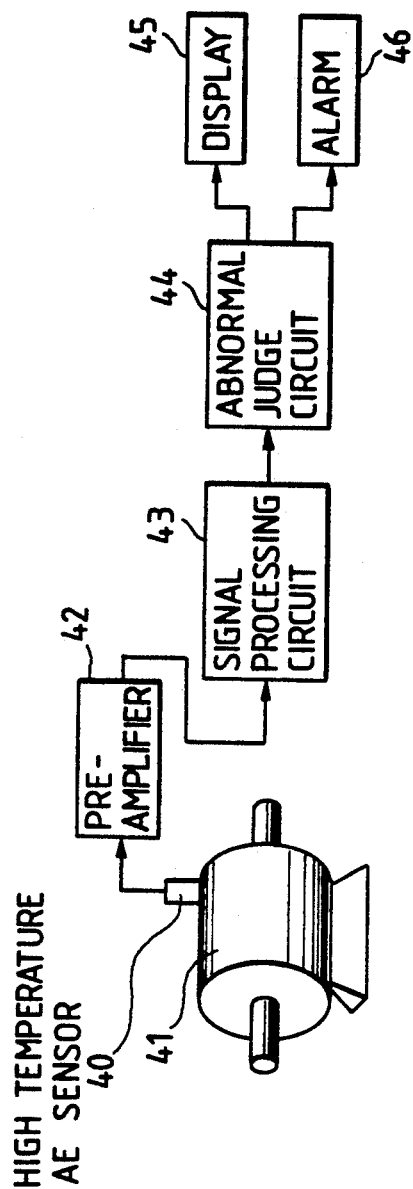
FIG. 9, 10 and 11 are block diagrams of application examples of the present invention.

According to the present invention, since it is possible to obtain a sensor for an AE method which is usable at a high temperature, it is possible to constitute a plant abnormality diagnostic apparatus of an AE system such as that shown in FIG. 9.

This apparatus is obtained by applying an AE sensor according to the present invention to an abnormality diagnostic apparatus for machines and equipments which are operated at a temperature as high as above 100° C. in a power plant, an iron manufacturing plant or the like in order to, for example, detect the leakage of steam in a steam pipe system or a damage of a sliding bearing at the initial stage, thereby preventing an accident. In FIG. 9, the reference numeral 40 represents the AE sensor according to the present invention shown in FIG. 1 or 5, and is produced for use at a high temperature. The AE sensor is directly disposed through a high-temperature grease in an equipment 41 such as a motor in a plant which is driven in a high-temperature state. It is in order to obtain the transmission of an elastic wave with efficiently that the AE sensor is provided through a grease.

The output of the AE sensor 40 is amplified to a predetermined level by a preamplifier 42 and supplied to an abnormality detecting portion 44 from a signal processor 43. When abnormality is detected, the output for actuating a display 45 and an alarm 46 is generated.

It is possible to detect abnormality quickly and preventing an accident by storing the level, wave form, etc. of an elastic wave which is detected from the sensor 40 when the equipment 41 is in a normal state in advance and comparing the level, wave, etc. with the current output of the elastic wave actually detected from the sensor 40.

Since it is possible to obtain an AE sensor which can sufficiently withstand a high temperature and which is highly accurate and reliable according to the present invention, as described above, such an AE sensor is applicable to a high-temperature atmosphere such as a plant. For example, if the sensor 40 is disposed in a steam pipe system, as described above, so as to detect the elastic wave from a pipe, valve, or the like, it is possible to detect a leakage of steam at an early stage.

Similarly, if the sensor 40 is directly disposed on a sliding bearing of a rotary machine, it is possible to prevent the generation of seizure by detecting an elastic wave generated due to the shortage of the oil film.

Figure 10:
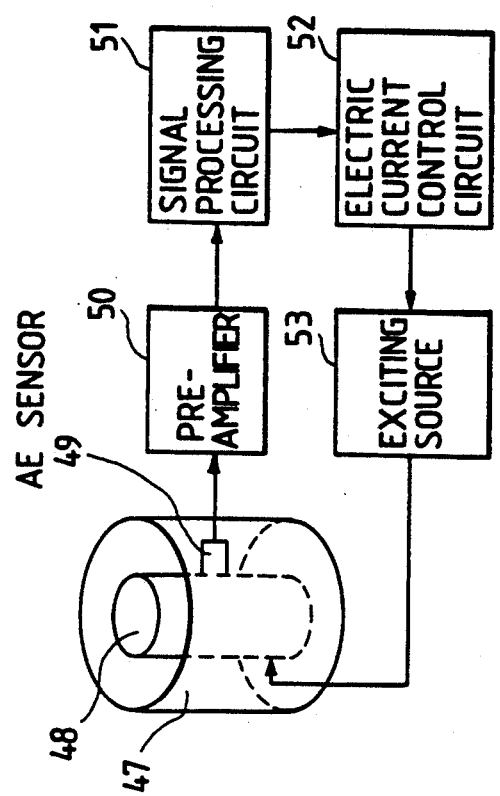

FIG. 10 shows an example of application of an AE sensor according to the present invention to a superconducting machine used at a very low temperature.

In such a superconducting machine, there exists what is called a quenching phenomenon in which a slight movement of a superconducting coil restores the superconducting state to a normal conducting state. In the example shown in FIG. 10, the quenching phenomenon is monitored by utilizing the fact that an AE sensor according to the present invention maintains the high accuracy and high reliability even at a very low temperature. In FIG. 10, the reference numeral 47 represents a superconducting machine, and 48 a coil in a very low temperature state in the superconducting machine 47.

An AE sensor 49 according to the present invention shown in FIG. 1 or 5 is disposed directly on or in the vicinity of the coil 48 in the very low temperature state.

A detection signal from the AE sensor 49 is supplied to a signal processing circuit 51 from a preamplifier 50, and the output of the signal processing circuit 51 is supplied to a conduction control unit 52. The output of an exciting power source 53 is controlled in accordance with the signal output from the conduction control unit 52. If a slight motion of the coil 48 of the superconducting machine 47 begins to be gradually propagated to various parts, an elastic wave is produced. Since the elastic wave is detected by the AE sensor 49, the conduction control unit 52 is actuated by this output so as to so control the exciting current of the coil 48 to prevent the generation of a quenching phenomenon. Thus, it is easy to obtain a stable operation state.

Figure 11:
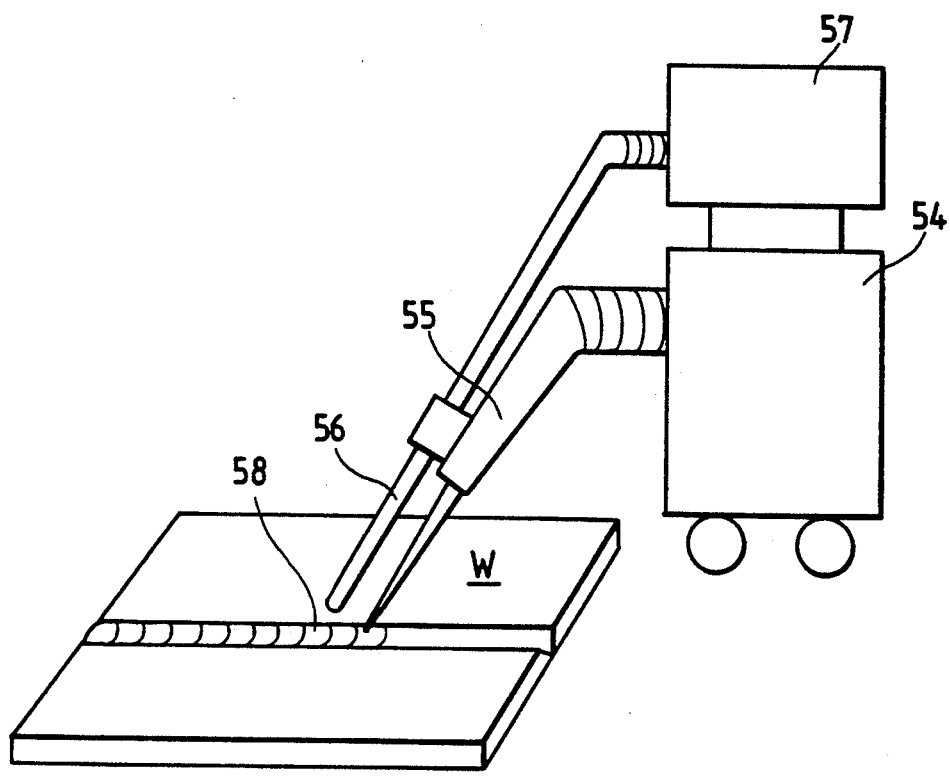

According to the present invention, since it is possible to obtain an ultrasonic transducer which is usable at a high temperature, it is possible to obtain a defect monitoring type automatic welder such as that shown in FIG. 11.

In FIG. 11, an automatic welder 54 is provided with a welding rod mounting portion 55 and automatically welds an object W of welding. A high-temperature ultrasonic transducer 56 which has been explained with reference to FIG. 8 is attached to the welding rod mounting portion 55, thereby enabling the welded portion 58 to be monitored with ultrasonic waves. The high-temperature ultrasonic transducer 56 is connected to the ultrasonic flaw detector 57.

In such a welder, the temperature in the vicinity of the welded portion generally becomes considerably high. According to the ultrasonic transducer of the present invention, however, since it is possible to maintain the high accuracy and the high reliability even in such a high temperature state, it is possible to monitor the state of the welded portion at real time in the example shown in FIG. 11, thereby facilitating welding of high reliability.

As explained above, the present invention provides a bonding type piezoelectric apparatus with a high reliability in which separation of the bonding portion and breakage of the piezoelectric element are prevented, and the method of manufacturing the same.

Further, the present invention provides a bonded type piezoelectric apparatus which is capable of being used in a sufficiently broad temperature range near from the absolute zero temperature to the Curie point of the piezoelectric element, and the method of manufacturing the same.

Still further, the present invention provides a piezoelectric actuator and a welding portion detecting apparatus which can be used in a high or low temperature portion through the use of the bonded type piezoelectric apparatus according to the present invention.

What is claimed is:

1. A bonded type piezoelectric apparatus, comprising:
   a piezoelectric ceramic material having at least one planar surface;
   an active layer of metal selected from the group consisting of Zr, Nb, Mo, Hf, Ta and W provided directly on said at least one planar surface;
   a securing member to which said piezoelectric ceramic material is bonded via a bonding layer provided between said active layer and said securing member; and a solder layer having a high fusibility with said bonding layer provided between said active layer and said bonding layer.

2. A bonded type piezoelectric apparatus according to claim 1, wherein said solder layer is made of a material selected from the group consisting of gold and silver.

3. A bonded type piezoelectric apparatus, comprising:
- a piezoelectric ceramic material having at least one planar surface;
- an active layer of metal selected from the group consisting of Zr, Nb, Mo, Hf, Ta and W provided directly on said at least one planar surface;
- a securing member to which said piezoelectric ceramic material is bonded via a bonding layer provided between said active layer and said securing member;
- a solder layer having a high fusibility with said bonding layer provided between said active layer and said bonding layer; and
- a barrier layer provided between said active layer and said solder layer, said barrier layer preventing diffusion of the metals in said active layer and said solder layer.

4. A bonded type piezoelectric apparatus according to claim 3, wherein said barrier layer is made of a material selected from the group consisting of Pt, Ni and Cr.

5. A bonded type piezoelectric apparatus, comprising:
- a piezoelectric ceramic material having at least one planar surface;
- an active layer of a metal having a high fusibility with said piezoelectric ceramic material provided directly on said at least one planar surface;
- a solder layer provided on said active layer;
- a securing member to which said piezoelectric ceramic material is bonded via a bonding layer made of a metallic solder material provided between said solder layer and said securing member, wherein said securing member is made of a material having a thermal expansion coefficient substantially the same as that of said piezoelectric ceramic material when said piezoelectric ceramic material is in a non-polarization condition;
- wherein said solder layer is made of a metal having a high fusibility with said bonding layer and wherein said securing member is a metal mounting plate or an insulating ceramic securing member.

6. A bonded type piezoelectric apparatus according to claim 5, wherein said securing member is made of a material having a thermal expansion coefficient less than $6 \times 10^{-6}/°C$.

7. A bonded type piezoelectric apparatus according to claim 5, wherein said securing member is a metal mounting plate.

8. A bonded type piezoelectric apparatus, comprising:
- a piezoelectric ceramic material having at least one planar surface;
- an active layer of a metal having a high fusibility with said piezoelectric ceramic material provided directly on said at least one planar surface;
- a solder layer provided on said active layer;
- a securing member to which said piezoelectric ceramic material is bonded via a bonding layer made of a metallic solder material provided between said solder layer and said securing member;
- wherein said solder layer is made of a material selected from the group consisting of gold and silver having a high fusibility with said bonding layer and wherein said securing member is a metal mounting plate or an insulating ceramic securing member.

9. A bonded type piezoelectric apparatus, comprising:
- a piezoelectric ceramic material having at least one planar surface;
- an active layer of a metal having a high fusibility with said piezoelectric ceramic material provided directly on said at least one planar surface;
- a solder layer provided on said active layer;
- a securing member to which said piezoelectric ceramic material is bonded via a bonding layer made of a metallic solder material provided between said solder layer and said securing member, wherein said solder layer is made of a metal having a high fusibility with said bonding layer and wherein said securing member is a metal mounting plate or an insulating ceramic securing member; and
- further comprising a barrier layer provided between said active layer and said solder layer, said barrier layer preventing diffusion of the metals in said active layer and said solder layer.

10. A bonded type piezoelectric apparatus according to claim 9, wherein said barrier layer is made of a material selected from the group consisting of Pt, Ni and Cr.

11. A bonded type piezoelectric apparatus according to claim 9, wherein said active layer is made of Ti, said barrier layer is made of Pt, and said solder layer is made of Au.

12. A bonded type piezoelectric apparatus comprising:
- a piezoelectric ceramic material having at least one planar surface;
- a metallizing layer provided directly on said one major planar surface; and
- a metal mounting plate to which said piezoelectric ceramic material is bonded via a bonding layer; wherein said metal mounting plate is made of a material having a thermal expansion coefficient substantially the same as that of said piezoelectric ceramic material when said piezoelectric ceramic material is in a non-polarization condition.

13. A bonded type piezoelectric apparatus according to claim 12, wherein said metal mounting plate is made of a material having a thermal expansion coefficient leas than $6 \times 10^{-6}/°C$.

* * * * *